United States Patent
Behnke et al.

(10) Patent No.: US 6,481,187 B1
(45) Date of Patent: Nov. 19, 2002

(54) POSITION SENSING SYSTEM AND METHOD FOR AN INSPECTION HANDLING SYSTEM

(75) Inventors: Merlin E. Behnke, Grafton, WI (US); Steven J. Alexander, Milwaukee, WI (US); Donald P. McGee, Oconomowoc, WI (US); Todd K. Pichler, New Berlin, WI (US); John Novak, Hartford, WI (US)

(73) Assignee: Robotic Vision Systems, Inc., Canton, MA (US)

( * ) Notice: Subject to any disclaimer, the term of this patent is extended or adjusted under 35 U.S.C. 154(b) by 0 days.

(21) Appl. No.: 09/462,555

(22) PCT Filed: Jul. 15, 1998

(86) PCT No.: PCT/US98/14618

§ 371 (c)(1),
(2), (4) Date: Apr. 7, 2000

(87) PCT Pub. No.: WO99/03733

PCT Pub. Date: Jan. 28, 1999

Related U.S. Application Data (60) Provisional application No. 60/052,698, filed on Jul. 16, 1997, and provisional application No. 60/076,702, filed on Mar. 4, 1998.

(51) Int. Cl.[7] .............................. B65B 7/28; B65B 5/04; B65B 57/00
(52) U.S. Cl. .............................. 53/471; 53/473; 53/51; 53/250; 53/281
(58) Field of Search .................. 53/471, 473, 281, 53/51, 58, 73, 74, 250, 505, 453, 591

(56) References Cited

U.S. PATENT DOCUMENTS

| 4,354,337 A | * | 10/1982 | Mori et al. | 53/558 |
| 4,860,522 A | * | 8/1989 | Cherney | 53/51 |
| 4,868,759 A | * | 9/1989 | Ross et al. | 53/51 |
| 5,191,693 A | * | 3/1993 | Umetsu | 53/453 |
| 5,648,136 A | * | 7/1997 | Bird | |

\* cited by examiner

*Primary Examiner*—Stephen F. Gerrity
(74) *Attorney, Agent, or Firm*—Michael Best & Friedrich LLP (57) ABSTRACT

A carrier tape drive used in conjunction with a pick and place module. The drive advances carrier tape to a desired position in two steps. The first step includes substantially stopping a carrier tape compartment short of a loading position, and the second step includes moving the compartment into the loading position.

22 Claims, 7 Drawing Sheets

POSITION SENSING SYSTEM AND METHOD FOR AN INSPECTION HANDLING SYSTEM

RELATED APPLICATIONS

This application is a national stage filing under 35 U.S.C. §371 of international application PCT/US98/14618, filed Jul. 15, 1998 and which designates the United States. The aforementioned international application claims the benefit under 35 U.S.C. §119 of co-pending provisional patent applications 60/052,698, filed Jul. 16, 1997 and 60/076,702, filed Mar. 4, 1998.

FIELD OF THE INVENTION

The invention relates to a position sensing system, and more particularly, to a position sensing system for use in a taper module of an inspection and handling system for devices such as semiconductors.

BACKGROUND OF THE INVENTION

Some devices, such as integrated circuit chips, need to be precisely fabricated. Accordingly, inspection of such devices is necessary to ascertain whether the devices meet exacting acceptance standards. The devices to be inspected are often provided in compartmented trays which have multiple rows and columns of pockets in which the devices are transported.

An inspection and handling system is utilized to inspect such devices. Trays of devices are transported through various stages of the inspection and handling system including laser scanning, inversion, camera scanning and individual placement at a final destination so that devices meeting the exacting acceptance standards are separated from those devices which do not meet such standards.

One final destination of devices that meet the acceptance standards is carrier tape. Typically, carrier tape is an elongate tape which includes pockets that are arranged in series. The pockets are typically shaped to be complementary to the dimensions of the devices that are to be housed therein. An instrument such as a vacuum operated precisor of a pick-and place system can transport a device from a tray into a pocket of the carrier tape. Once devices are individually placed into the pockets of the carrier tape, a cover tape is often applied and the carrier tape with devices housed in the sealed pockets can be wound onto a reel and conveniently transported to another destination, such as where the devices will be put into final use.

Pick and place systems are generally capable of motion in one direction (transverse to the direction of movement of trays through the inspection and handling system) and have limited, if any, movement in a direction perpendicular to that motion (parallel to the direction of movement of the trays). Therefore, the carrier tape needs to be incrementally moved by a drive system so that the pick and place system can place devices into successive pockets of the carrier tape. It is therefore necessary to determine the location of individual pockets of the carrier tape with respect to the pick and place system. Typically, the carrier tape includes sprocket holes that run the length of the carrier tape on one or both sides of the pockets. The sprocket holes are utilized to determine the position of a pocket relative to the pick and place system.

In some inspection and handling systems, problems may occur if the carrier tape is not consistently advanced by the proper distance equivalent to the length of one pocket. Traditionally, the beginning of a pocket is determined by forwarding the carrier tape by a fixed distance, and assuming that the carrier tape moved forward the distance programmed. Use of a sensor may also be employed to detect the number of sprocket holes passed as the carrier tape is advanced. In such systems, the drive system assumes that the point to which the carrier tape is forwarded is the correct starting point of the pocket.

Specifically, in some systems, simply advancing the carrier tape by a set distance, or counting the number of sprocket holes passed, may not be sufficiently accurate in determining the position of a pocket. Jitter or slipping of the carrier tape can occur. In the case of slipping, the carrier tape may not be advanced the amount the drive system is programmed to advance. In the case of jitter, the carrier tape may move backward, thereby counting a sprocket hole twice. Accordingly, errors may incur in determining the location of a pocket.

An object of this invention is to achieve accurate and reliable placement of a carrier tape, or the like, relative to a pick and place assembly or the like.

SUMMARY OF THE INVENTION

For the achievement of those and other objects, this invention proposes to achieve the desired placement of the carrier tape in two steps. A first step positions one of the compartments in the tape in the vicinity of but not at the final placement position, and the second subsequent step moves the compartment into placement position.

More specifically, the carrier tape has a plurality of compartments of a size to receive one semiconductor device. The compartments are serially spaced along the longitudinal axis of the tape and the tape also includes a plurality of sprocket holes serially spaced along a line which is parallel to said longitudinal axis. The distance between compartments corresponds to a predetermined number of sprocket holes and, in the first step, the tape is advanced a distance corresponding to less than that predetermined number of sprocket holes. In the second step, the tape is advanced the remaining number of said sprocket holes. Preferably, the first step is equal to one less than the distance between the predetermined number of sprocket holes and the second step is equal to the distance to the last sprocket hole.

Preferably, this invention also contemplates transporting the tape by engaging the tape surfaces and not the sprocket holes, and it includes the capability of inspecting for the presence of a device in the tape compartment and proper positioning of the device in the compartment.

BRIEF DESCRIPTION OF THE DRAWINGS

FIG. 10 is a schematic diagram of the tape positioning sensing system; and

Before one embodiment of the invention is explained in detail, it is to be understood that the invention is not limited in its application to the details of construction and the arrangement of components or steps set forth in the following description or illustrated in the drawings. The invention is capable of other embodiments and of being practiced or being carried out in various other ways. Also, it is to be understood that the phraseology and terminology used herein is for the purpose of description and should not be regarded as limiting.

DETAILED DESCRIPTION OF THE PREFERRED EMBODIMENT

Before describing the tape positioning system, a type of carrier tape packaging system will be described.

With reference to the drawings, the tape positioning system 100 is shown in association with a precisor 200 of a typical pick and place (PNP) system. The PNP system will only be shown schematically to illustrate its relationship with the tape positioning system.

The relationship of the PNP system to the overall inspection and handling system and a taper system or module can be as set forth in co-pending U.S. application Ser. No. 09/142,338, filed Sep. 27, 1999 and entitled "Inspection Handler Apparatus and Method" and assigned to the assignee of this application. If details of those relationships are necessary, reliance is placed on that co-pending application.

The tape system includes a carrier tape drive 102 that draws carrier tape from a supply reel assembly 104 and conveys the carrier tape through a device placement station 106, several inspection stations, a cover tape placement station 108, and a heat seal station 110 to an outfeed reel assembly 112. Further, it includes a frame 114 whereon the major assemblies are mounted and a control system 116 for coordinating the various operations of the tape positioning system.

In general terms, carrier tape 120 is drawn from reel 104 by the combination of friction roller 122, driven by drive 102, and friction roller 124, driven by drive 126. The carrier tape travels through placement station 106, is engaged with covering tape 128 from reel 130, then passes through heat seal station 110 where the cover tape is sealed to the carrier tape, and goes to its destination on reel 112.

Figure 2:
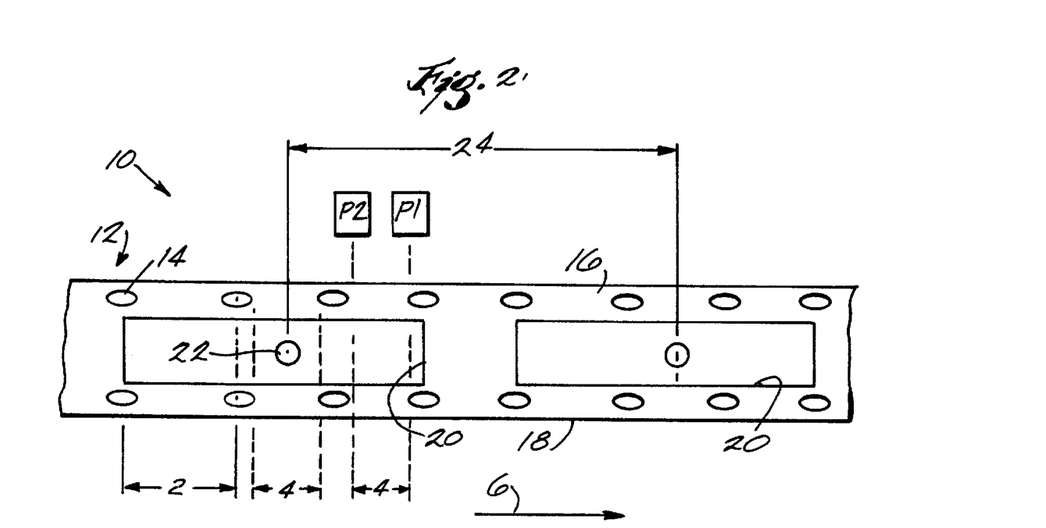
FIG. 2 is a plan view, in schematic form, of a carrier tape with the positioning sensor.

FIG. 2 depicts one of several types of carrier tape 12 used in the semiconductor industry and adaptable for use in this system. Rectangular shaped device pockets 20 are spaced uniformly along the longitudinal axis of the carrier tape 12. The pockets are dimensioned to fit with a particular semiconductor device and each pocket includes a central test hole 22. The distance between test holes 22 is commonly referred to as the pitch 24 of the carrier tape.

The carrier tape also has a series of uniformly spaced sprocket holes 14 provided along one or both edges 16 and 18 of the carrier tape. The sprocket holes are a means for driving the carrier tape. Typically, the sealed carrier tape provided by the tape system is unwound by the semiconductor device user using the sprocket holes 14. To reduce the risk of damage to the sprocket holes, this taper positioning system does not use the sprocket holes 14 to drive the tape 102 through the taper module.

In lieu of sprockets, this tape system utilizes soft friction rollers at both the main drive, roller 122, and the take-up drive, roller 124, to drive and guide the carrier tape through the various stations to the carrier tape 102 as the carrier tape is driven by the soft roller.

Figure 3:
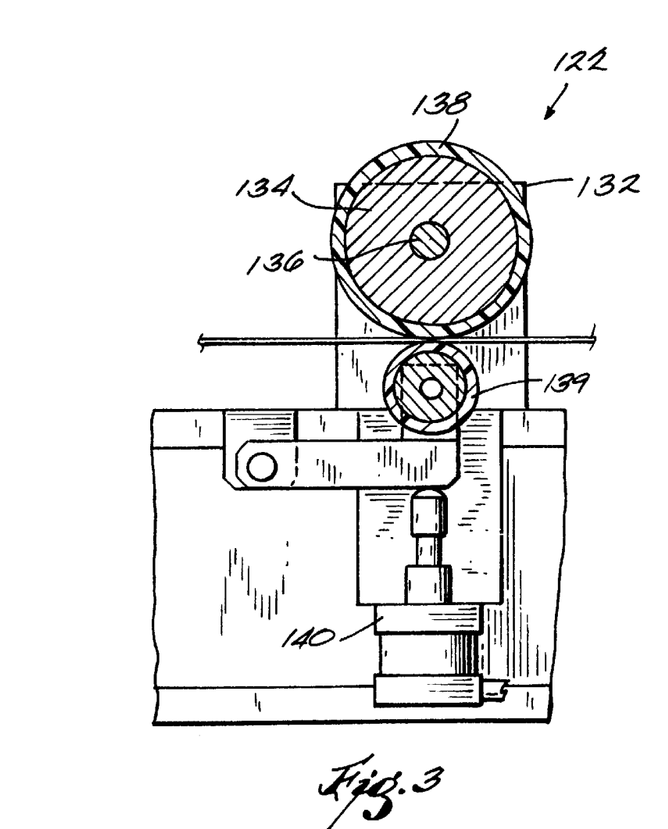
FIG. 3 is a side view of the drive roller assembly.
Figure 4:
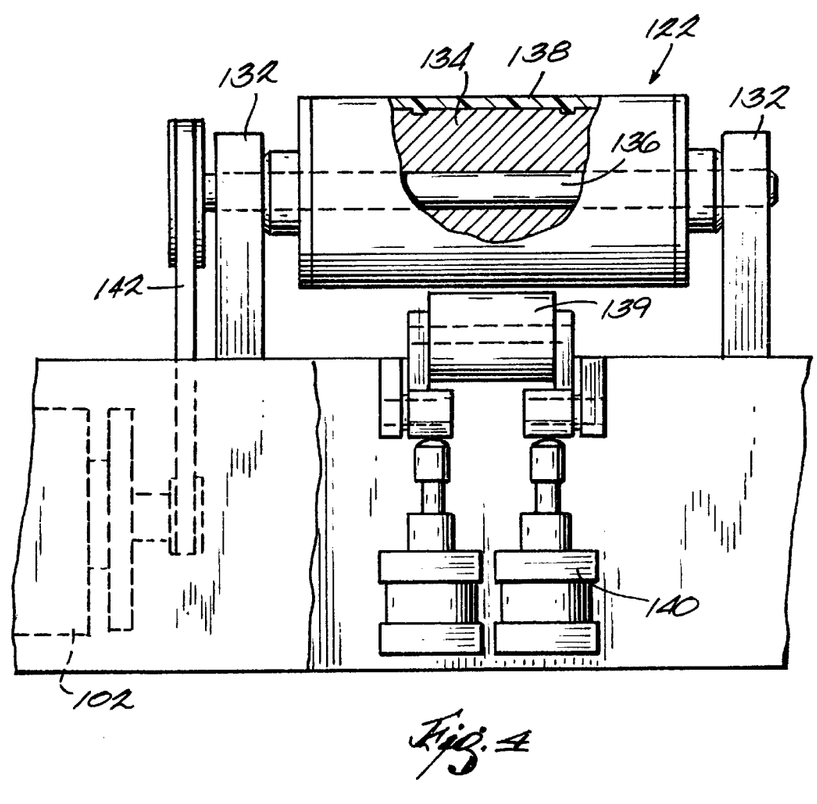
FIG. 4 is an end view, partly in section of the drive roller assembly of FIG. 3.

Referring to FIG. 3, a main drive roller 122 is mounted between a pair of mounting blocks 132 near the left ends of the guide rails 146, 148. The main drive roller comprises a core 134 mounted onto a drive shaft 136 and has an outer layer 138 of urethane material.

A pinch roller 139 is supported beneath roller 122 and preferably is of the same general construction as roller 122. A pneumatic assembly 140 is connected to the mount for roller 139 and is operative to move the roller 139 up or down to vary the pressure exerted on the carrier tape as it passes between the rollers.

Drive shaft 136 is driven by stepper motor 102 through a pulley system 142.

Figure 5:
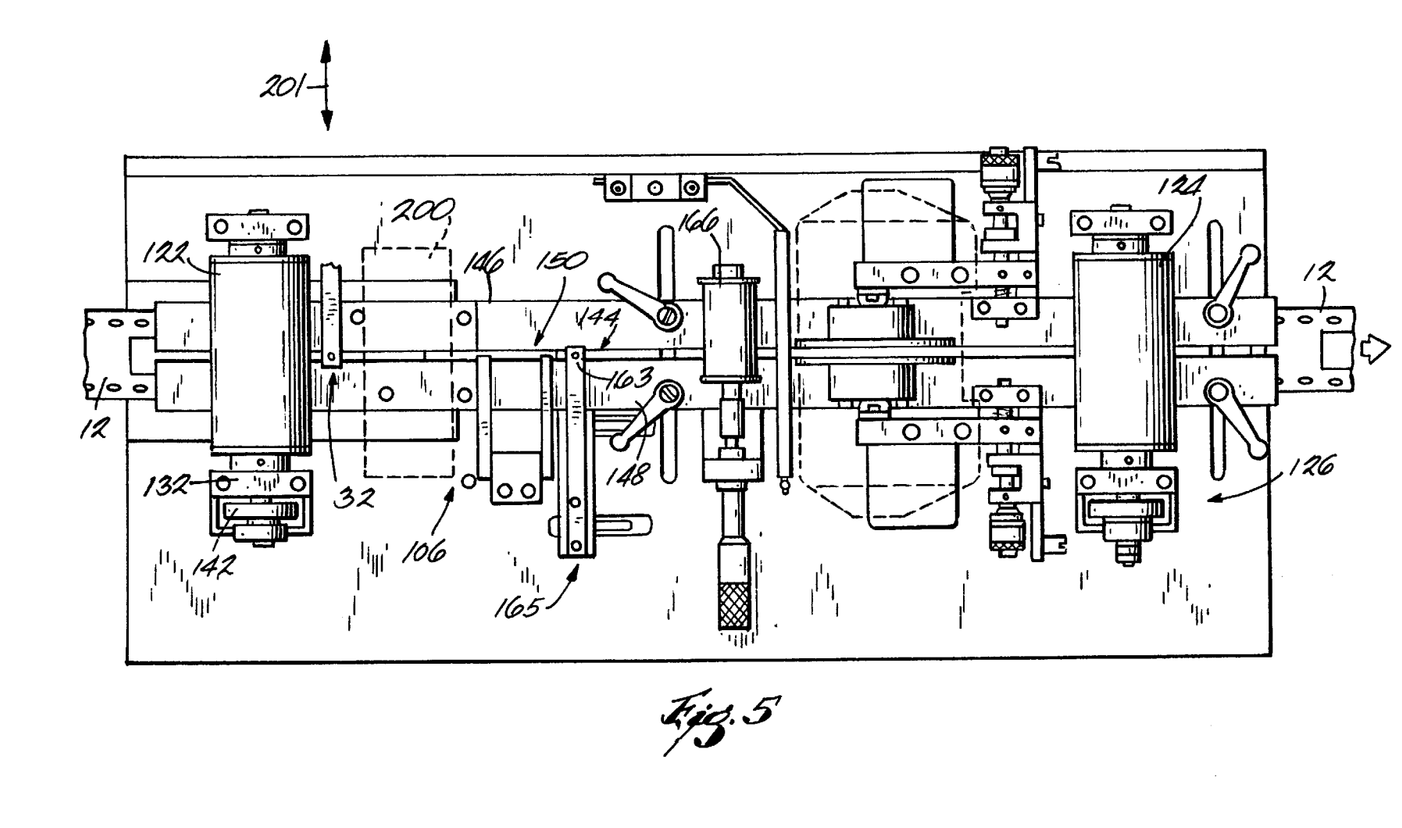
FIG. 5 is a plan view of the tape positioning system of FIG. 1.

Elongated guide rails 146, 148 (See FIG. 5) extend from the drive roller 122 through roller 124. The carrier tape 120 is shown entering the roller 122 and exiting roller 124 but not between for clarity of illustration of the intervening parts. The edges of the carrier tape are caused to travel snugly over the guide rails 146, 148 as it is conveyed through the device placement and inspection stations. The center hole 22 of the individual pockets of the carrier tape is maintained positioned directly above the centerline of the rail gap 144.

The precisor 200 (shown in dotted lines in FIG. 5) from the PNP module is positionable overhead of the guide rails to the right of the main drive roller 122 and over the rail gap 144. The precisor places devices into individual pockets 20 of the carrier tape. The precisor, except for the device which actually engages the circuit devices by moving vertically, is capable of movement in only one direction. That direction is illustrated by arrow 201 in FIG. 5.

A tape position sensor assembly 32 is mounted adjacent the front guide rail 146 and will be described more completely hereafter.

Figure 6:
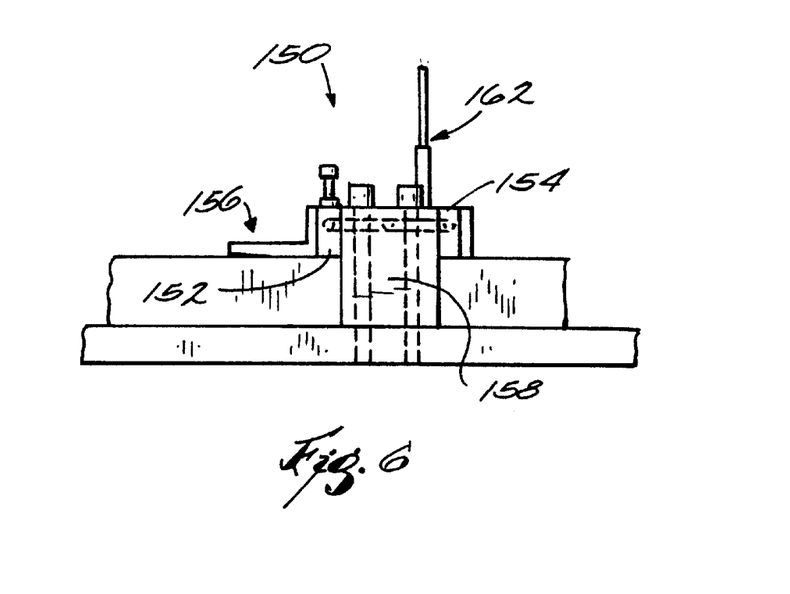
FIG. 6 is a side view of the device sensing mechanism.
Figure 7:
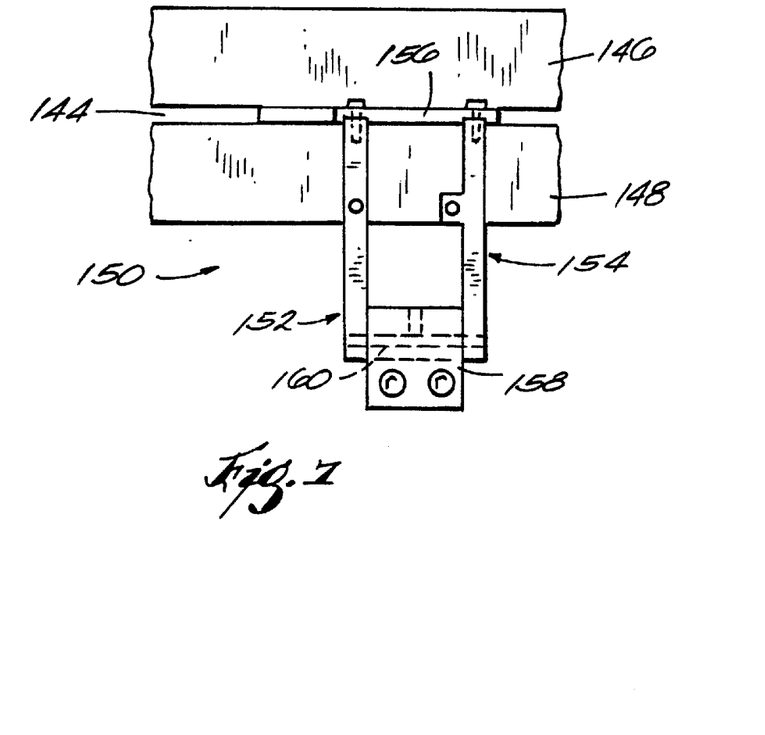
FIG. 7 is a plan view of the mechanism of FIG. 6.

Referring again to FIGS. 5 and 6, a part hold down assembly 150 is disposed to the right of the tape position sensor assembly 32 and the device placement station 106. Referring to FIGS. 6 and 7, the hold down assembly 150 includes a left pivot arm 152 and a right pivot arm 154, and a hold down bar 156 that is fastened across both pivot arms 152, 154. The pivot arms 152, 154 extend over the rear guide rail 148 and support the hold down bar 156 directly over the rail gap 144.

The pivot arms 152, 154 are pivotably connected to a mounting block 158 by a bushing 160. The part hold down assembly is biased such that the arms 152, 154 pivot downward and the hold down bar 156 rests down onto the carrier tape. A leading or left end of the hold down bar 156 may be beveled so as to guard against the hold down bar catching on the passing carrier tape. The hold down bar 156 typically rides over the carrier tape pockets as the carrier tape is conveyed forward. Pressure applied by the hold down bar on the carrier tape helps to keep devices in the carrier pockets.

Further, a proximiter probe 162 is vertically mounted to the left pivot arm 152 at a location directly above the rear guide rail 148. The probe end extends downwardly through the left pivot arm 152 and is set to face the top surface of the front guide rail 148. The proximiter probe senses vertical displacement of the left pivot arm 152. When an unseated device protrudes outward of a pocket 20, the hold down bar 156 and the left pivot arm 152 are displaced upwardly as the carrier tape passes underneath, thereby alarming the probe. In this event, the carrier tape drive may be prompted to reverse index the carrier pocket so that the unseated device is returned to the device placement station. At that point, the precisor may pick and discard the unseated device, and replenish the carrier pocket with another device.

A missing part photo sensor assembly 165 of conventional construction is preferably the through-beam type is disposed to the right of the hold down bar assembly 150 and directly overhead of the rail gap 144 and includes a photo sensor 163 located above rail gap 144 and emitter cone assembly (not shown) supported below the rail gap 144.

When a carrier tape pocket 20 is moved past the photo sensor without a device therein, the exposed center hole allows the through beam to be picked up by the emitter cone. Accordingly, the carrier tape drive is prompted to move the carrier tape in the reverse direction until the empty pocket is vertically aligned with the device placement station. At this point, the precisor is prompted to place a device in the empty carrier pocket.

After passing through those testing stations, the carrier tape pocket is ready to be sealed. In the cover tape placement station 108, cover tape is directed over the pockets. The cover tape placement station 108 includes a supply reel 130 that is mounted overhead of the guide rails 146, 148.

Below the supply reel shaft, an idler roller 167 and a conventional vacuum manifold 164 are separately mounted to the support place. The cover tape travels from the supply reel 130, underneath the idler roller 167 and over the vacuum manifold 164 before engaging the cover tape roller 166. The vacuum manifold applies a constant drag on the cover tape between the vacuum manifold 164 and the cover tape roller 166. The cover tape is brought into engagement with the carrier tape under roller 166 and covers the pockets 20 in the carrier tape.

After the cover tape is applied over the carrier tape, the carrier tape is conveyed to the heat seal station 110. The heat seal mechanism is conventional and thus will not be described in detail.

The roller 124 is a take up roller. In the preferred embodiment of the invention, the main drive roller assembly 102 has the primary responsibility for pushing the carrier tape, while the take-up drive roller assembly 124 maintains tension on the carrier tape. The take-up drive roller assembly is disposed across the guide rails 146, 148 to near to the right end of the module frame, feeding sealed carrier tape to the outfeed reel assembly 112.

The construction and arrangement of the take up roller 124 and its associated parts is the same as that at main drive roller 122, including the pressure roller and pneumatic assembly to vary pressure between the main roller and the pressure roller, and a stepper motor to drive roller 124. For that reason, it will not be described in detail. The relative speeds of rotation of the rollers 122 and 124 are controlled in a conventional manner to maintain the proper tension on the carrier tape as it passes through the various operations.

Referring to the drawings, FIG. 2 illustrates a tape position sensing system 10 which operates to determine the position of carrier tape 102.

The carrier tape 12 has a series of uniformly spaced sprocket holes 14 provided along one or both edges 16 and 18 of the carrier tape 12. The sprocket holes 14 can be used as a means for driving the carrier tape 12. A plurality of pockets, such as pocket 20, are positioned sequentially along the carrier tape 12, and are dimensioned to be complementary to devices that are to be housed therein.

After devices have been housed in the pockets 20 of the carrier tape 12, the ultimate user of the devices typically will utilize the sprocket holes 14 as a means by which to move the carrier tape 12. To reduce or eliminate the risk of damage to the sprocket holes 14, it is preferable that the inspection and handling system does not utilize the sprocket holes 14 as part of the drive system. Preferably, a friction drive is utilized to move the carrier tape 12 through the taper module of the inspection and handling system. The friction drive will be described hereinafter.

In the present invention, to determine the beginning of a pocket 20 of the carrier tape 12 and thus the proper position of the tape and compartment, a known fixed distance to advance the carrier tape 12 (corresponding to a set number of sprocket holes) is preprogrammed such as in an encoder. This fixed distance lies between the last sprocket hole (n) and the second to last sprocket hole (n−1) adjacent to the end of pocket 20, where n is the number of sprocket holes corresponding to the spacing between pockets 20.

A pair of conventional photo sensors P1 and P2 detect the passing of the serial sprocket holes 14 as the carrier tape 12 is advanced by the drive system.

Figure 1:
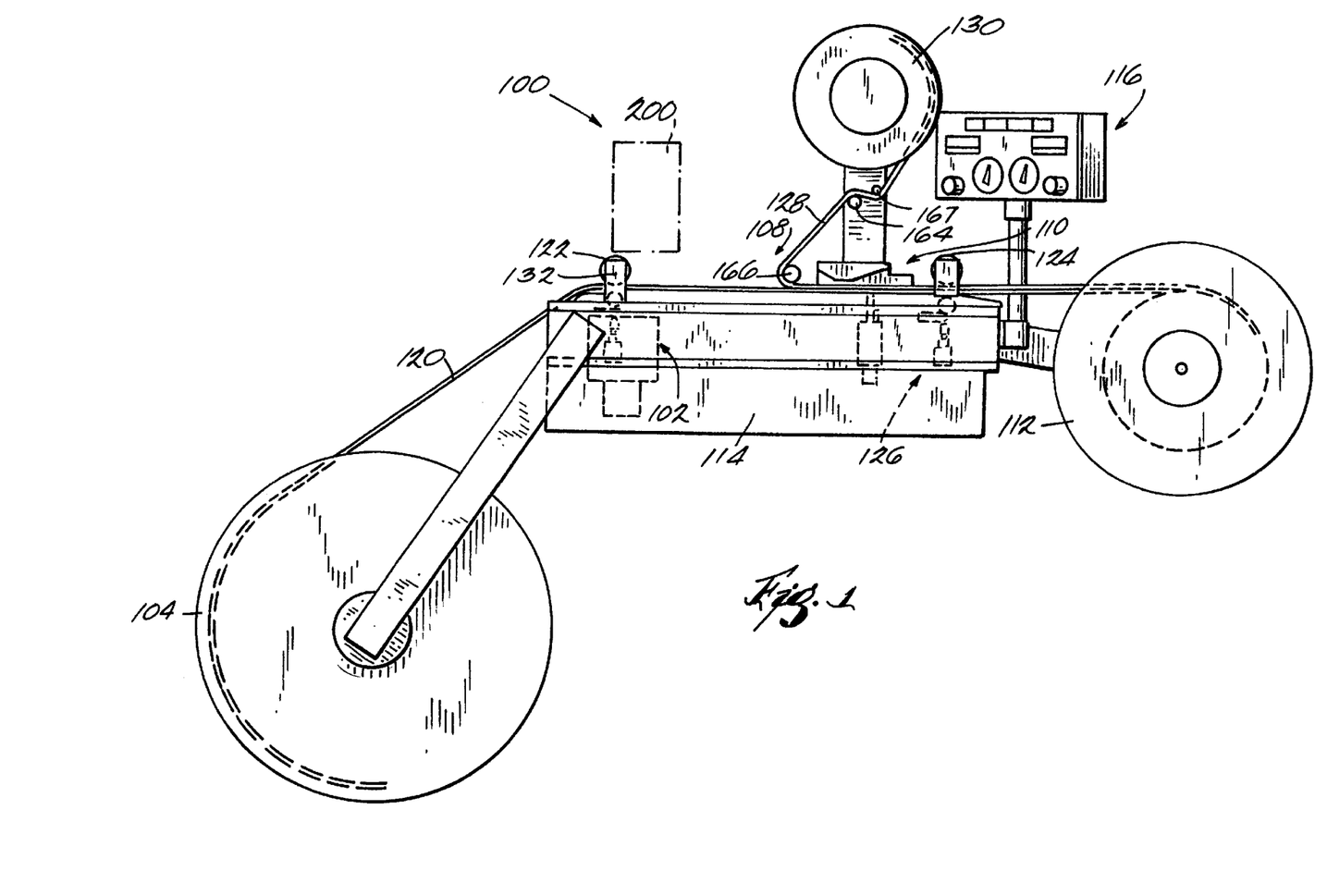
FIG. 1 is a side elevation of a tape positioning system embodying this invention.
Figure 1B:
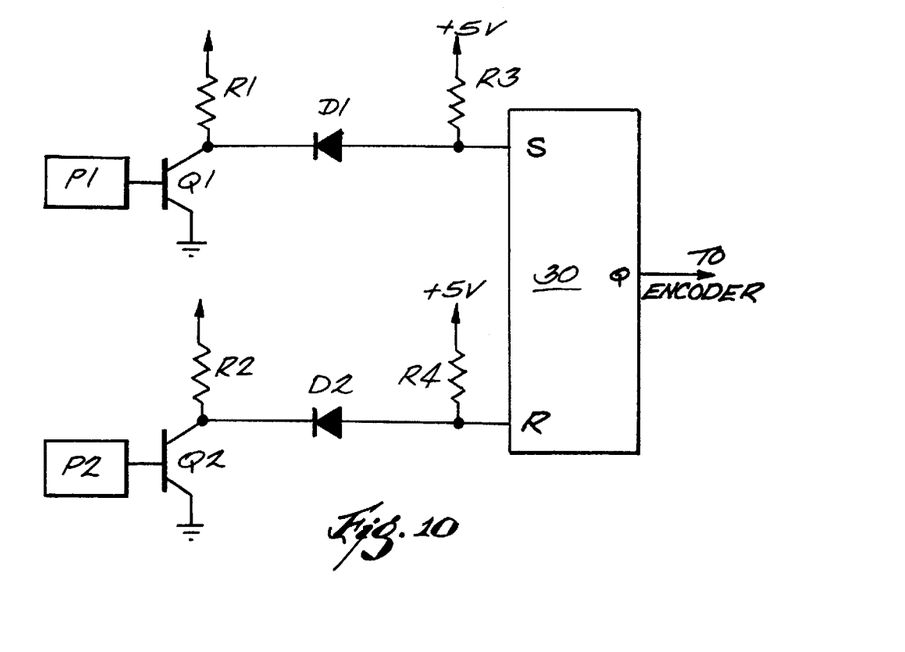

In the embodiment shown in FIG. 1, P1 and P2 are 2 mm apart and a pocket length is the distance between four of the sprocket holes 14. The number of sprocket holes 14 passed by the photo sensors P1 and P2 is counted by the encoder. Preferably, the carrier tape 12 is advanced rapidly ("jumped") by the drive system the distance of the jump zone, n−1 sprocket holes. The carrier tape 12 is then slowly advanced ("crept") by the drive system until the edge of the last sprocket hole 14 (n) is reached. The photo sensors P1 and P2 are used to determine when the edge of the $n^{th}$ sprocket hole 14 is reached to determine the end of the current pocket 20, and accordingly, the beginning of the next pocket 20.

With reference to FIG. 2, the sprocket holes are spaced on centers 2, in the preferred embodiment 4 mm. There is a distance 4 between the leading and trailing edges of adjacent sprockets, that is leading and trailing relative to the direction of travel of the tape illustrated by arrow 6. In the preferred embodiment, the spacing between is equal to or less than the distance 4. Specifically in this embodiment the spacing 4 equals 2 mm.

With reference to FIG. 10, a circuit schematic of the tape position sensing system 10 is illustrated. The circuit processes the information received from the photo sensors P1 and P2 resulting from the detection of the passing of sprocket holes 14. Specifically, the photo sensors P1 and P2 are electrically connected to transistors Q1 and Q2. Each source of transistors Q1 and Q2 is electrically connected to a conventional SR flip-flop 30, through Schottky diodes D1 and D2. The source of transistor Q1 is electrically connected to the "S" input of SR flip-flop 30, and the source of transistor Q2 is electrically connected to the "R" input of SR flip-flop 30. Each drain of transistors Q1 and Q2 is grounded.

When the first or leading photo sensors P1 detects a sprocket hole 14, a signal is sent to transistor Q1 and to flip-flop 30, setting the flip-flop 30. When the second or trailing photo sensors P2 detects a sprocket hole 14, a signal is sent to transistor Q2 and to flip-flop 30, resetting the flip-flop. As flip flop 30 is set and reset, the "Q" output of the flip flop is fed to the encoder which increments a sprocket hole counter. The sprocket holes being advanced are counted in this manner.

Figure 8:
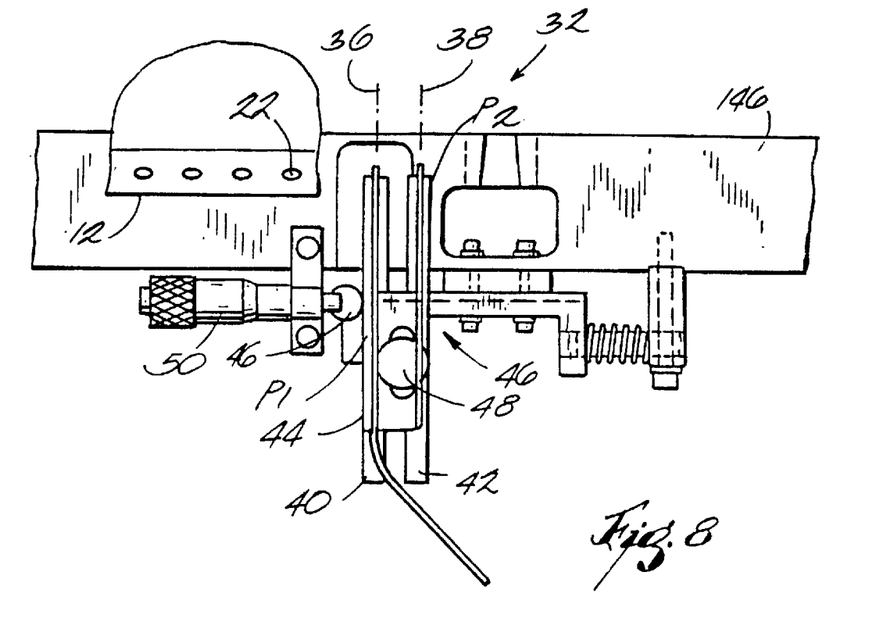
FIG. 8 is a plan view of a sensor assembly.
Figure 9:
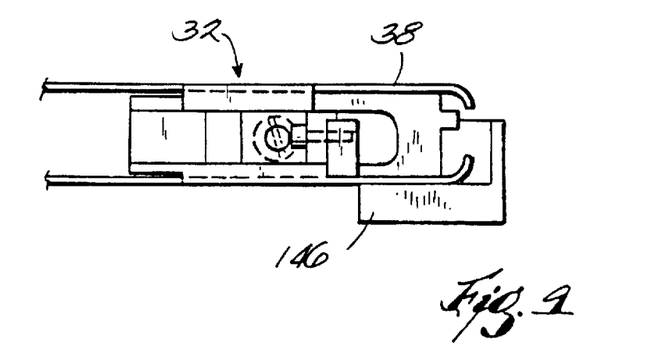
FIG. 9 is a side view of a sensor assembly.

Turning now to FIG. 8, the photo sensors P1 and P2 are shown. A sensor assembly 32 is mounted adjacent to a front guide rail 146 of the taper module. The sensor assembly 32 supports the photo sensors P1 and P2. Each photo sensor P1 and P2 typically includes a beam element 36 and 38, and pick-up elements 40 and 42 opposed to elements 36 and 38, respectively. One of the pick up elements 42 is visible in FIG. 8. When the carrier tape 12 is caused to move linearly along the rail guide 146, the series of sprocket holes 14 pass directly between the beam elements 36 and 38 and the pick-up elements 40 and 42.

The sensor assembly 32 is mounted horizontally on an elongated support block 44 that extends substantially into a slot on the front guide rail 146. As illustrated, both photo sensors P1 and P2 are mounted on the same support block 44. However, it is contemplated that each sensor P1 and P2 may be supported separately and accordingly, the position of each photo sensor P1 and P2 may be adjusted separately. The support block 44 is mounted to a bracket via a ball slide 46. By operating a rotatable dial 48, the support block 44 may be secured to or loosened from the bracket. A micrometer 50 is mounted on the left of the support block 44 and engages the support block 44 with a ball tip 46. Through adjustment of the micrometer 50, the lateral position of the sensor assembly 32 in the slot of the front guide rail 34 may be fine tuned.

Figure 11:
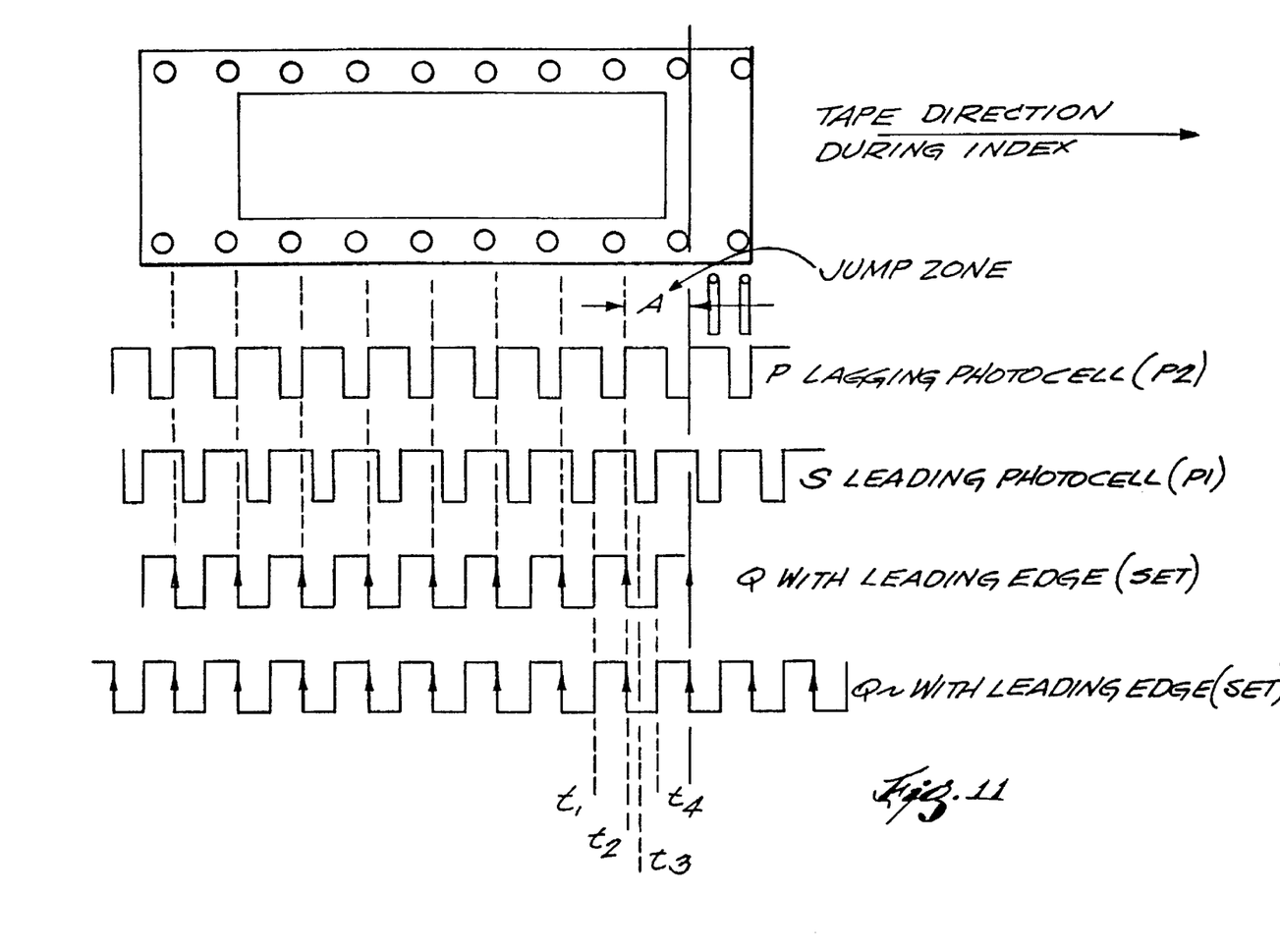
FIG. 11 is a timing diagram of the tape position sensing system.

With reference to FIG. 11, a timing diagram of photocell detection and its relationship with the flip-flop 30 is illustrated. "Q" is ON (set) every time S is ON. S is triggered or ON when the leading photo sensor P1 sensors a sprocket hole 14. "Q" is OFF (reset) every time R is ON. R is triggered or ON when the lagging photocell P2 detects a sprocket hole 14. As illustrated in FIG. 11, the leading photo sensor P1 is turned ON at time $t_1$ when the second to last (n−1) sprocket hole 14 is reached. This sets "Q" in the ON position. "Q" is not reset until time $t_2$ when the lagging photo sensor P2 is turned ON. "Q" remains in the OFF position until time $t_4$, when the photo sensor P1 is once again activated. This occurs when the beginning of each sprocket hole is reached. Accordingly, the pair of photo sensors P1 and P2 consistently detect each serial sprocket hole 14 up to the nth sprocket hole for a given pocket size. That is, it counts the sprocket holes passing the sensor.

Utilizing photo sensors P1 and P2 in this manner eliminates any potential jitter problems that may occur.

As the carrier tape 12 is advanced the distance between sprocket holes n−1 and n, the carrier tape 12 can move (i.e. jitter) backwards slightly, as opposed to always moving forward. In such a case, if the carrier tape 12 is advanced to just beyond the n−1 sprocket hole 14, and jitter forces the carrier tape 12 slightly backward, either photo sensor P1 or P2 may count the n−1 sprocket twice.

However, by using the pair of photo sensors P1 and P2 in tandem as disclosed in this invention, both the leading edge and trailing edge of each sprocket hole 14 must be encountered before allowing the encoder to increment or decrement the sprocket hole 14 count. Jitter does not move the carrier tape 12 so far back such that both photo sensors P1 and P2 are activated. Accordingly, slight jitter will not increment the counter, and therefore, the sprocket hole count of the encoder remains accurate.

What is claimed is:

1. In a system for loading devices into a carrier tape having a plurality of compartments of a size to receive one of said devices, wherein said compartments are serially spaced along the longitudinal axis of said tape and include a first compartment immediately adjacent to a second compartment, wherein said tape also includes a plurality of sprocket holes serially spaced along a line which is parallel to said longitudinal axis, and wherein said tape is transported to a placement position in which said devices are placed into said compartments, the steps of positioning said compartments at said placement position in three steps, a first step positioning said first compartment in said placement position, a second step positioning and substantially stopping said second compartment in the vicinity of but not at the placement position while simultaneously moving said first compartment out of said placement position and the third subsequent step moving said second compartment into said placement position.

2. The system of claim 1 wherein at the end of said second step said second compartment is located, relative to the travel of said tape to said placement position, upstream of said placement position.

3. The system of claim 1 wherein the distance between compartments corresponds to a predetermined number of sprocket holes and including the steps of controlling the transport of said tape by counting the passage of sprocket holes past a preselected area in the path of travel of said tape, effecting the end of said second step when less than all of said predetermined number of sprocket holes have passed said preselected area, and effecting the end of said third step when all of said predetermined number of sprocket holes have passed said preselected area.

4. The system of claim 3 wherein the predetermined number of sprocket holes is n and the end of said second step is effected when n−1 sprocket holes have passed said preselected area.

5. The system of claim 4 wherein at the end of said second step said second compartment is located, relative to the travel of said tape to said placement position, upstream of said placement position.

6. The system of claim 5 including the step of transporting said tape by engaging the tape surfaces and not the sprocket holes.

7. The system of claim 6 including the steps of inspecting the orientation of a device in a compartment downstream of said placement position, and in response to a device being displaced in a compartment reversing the direction travel of said tape and returning said tape to said placement position.

8. The system of claim 7 including the steps of transporting a cover tape into overlapping relationship with said carrier tape downstream of said placement position, and engaging said cover tape with said carrier tape and sealing said cover tape to said carrier tape to close said compartment.

9. In a system for loading devices into a carrier tape having a plurality of compartments of a size to receive one of said devices, wherein said compartments are serially spaced along the longitudinal axis of said tape, wherein said tape also includes a plurality of sprocket holes serially spaced along a line which is parallel to said longitudinal axis, and wherein said tape is transported to a placement position in which said devices are placed into said compartments, the steps of positioning said compartments at said placement position in two steps, a first step positioning one of said compartments in the vicinity of but not at the placement position and the second subsequent step moving said compartment into said placement position, and including the step of transporting said tape by engaging the tape surfaces and not the sprocket holes.

10. In a system for loading devices into a carrier tape having a plurality of compartments of a size to receive one of said devices, wherein said compartments are serially spaced along the longitudinal axis of said tape, wherein said tape also includes a plurality of sprocket holes serially spaced along a line which is parallel to said longitudinal axis, and wherein said tape is transported to a placement position in which said devices are placed into said compartments, the steps of positioning said compartments at said placement position in two steps, a first step positioning one of said compartments in the vicinity of but not at the placement position and the second subsequent step moving said compartment into said placement position, wherein the distance between compartments corresponds to a predetermined number of sprocket holes, in said first step said tape is advanced a distance corresponding to less than said predetermined number of sprocket holes, and in said second step said tape is advanced the remaining number of said sprocket holes to totally advance said tape the predetermined number of sprocket holes.

11. The system of claim 10 including the step of counting the number of sprocket holes advanced in said first and second steps.

12. In a system for loading devices into a carrier tape having a plurality of compartments of a size to receive one of said devices, wherein said compartments are serially spaced along the longitudinal axis of said tape, wherein said tape also includes a plurality of sprocket holes serially spaced along a line which is parallel to said longitudinal axis, and wherein said tape is transported to a placement position in which said devices are placed into said compartments, the steps of positioning said compartments at said placement position in two steps, a first step positioning one of said compartments in the vicinity of but not at the placement position and the second subsequent step moving said compartment into said placement position, wherein said tape compartment has a base and upstanding side walls extending from said base to a surface of said tape and a hole is provided in said base and including the steps of inspecting said compartment through said hole after operation to place a device in said compartment, and in response to said inspection determining that there is no device in one of said compartments reversing the direction of transport of said tape and returning said one of said compartments to said placement position.

13. In a system for loading devices and including a source of carrier tape having a plurality of compartments of a size to receive one of said devices and wherein said compartments are serially spaced along the longitudinal axis of said tape, wherein said tape includes a plurality of sprocket holes serially spaced along a line which is parallel to said longitudinal axis, and including a drive for transporting said tape to a placement position in which said devices are placed into said compartments, the combination comprising, a sensor positioned in the path of movement of said sprocket holes and operatively connected to and controlling said drive, said sensor responding to the passage of a sprocket hole and de-energizing said drive in response to the passage of said sprocket holes to position one of said compartments in a predetermined location.

14. The system of claim 13 wherein the distance between compartments corresponds to a predetermined number of sprocket holes, said sensor de-energizes said drive when less than the predetermined number of sprocket holes passes said sensor, said drive is re-energized, and said sensor again de-energizes when the number of sprocket holes remaining in said predetermined number are sensed by said sensor.

15. The system of claim 14 wherein said sensor includes first and second sensing devices spaced one from the other in the direction of travel of said tape, and said first and second sensing device respond to the passage of, relative to direction of tape travel, a leading edge of a sprocket hole.

16. The system of claim 15 wherein said sprocket holes are spaced apart a distance d, and said first and second sensing devices are spaced apart the distance d.

17. The system of claim 16 wherein each of first and second sensing devices each include a pair of sensing elements, one sensing element positioned on one side of said tape and the second sensing element positioned on the other side of said tape so that said tape sprockets pass between said pairs of sensing elements.

18. A method for loading devices into a carrier tape having a plurality of compartments of a size to receive one of the devices, the plurality of compartments including a first compartment immediately adjacent to a second compartment, the method comprising:

positioning the first compartment in a placement position;

positioning and substantially stopping the second compartment in the vicinity of, but not at, the placement position while simultaneously moving the first compartment out of the placement position;

moving the second compartment into the placement position; and placing a device in the second compartment while the second compartment is in the placement position.

19. The method of claim 18, wherein the second compartment is located upstream of the placement position at the end of positioning and substantially stopping the second compartment.

20. The method of claim 18, wherein the carrier tape includes a plurality of sprocket holes, the method further comprising transporting the carrier tape by engaging surfaces of the carrier tape and not the plurality of sprocket holes.

21. The method of claim 18, wherein the carrier tape includes a plurality of sprocket holes, and wherein the distance between compartments corresponds to a predetermined number of the sprocket holes;

wherein positioning and substantially stopping the second compartment advances the carrier tape a distance corresponding to less than the predetermined number of the sprocket holes;

wherein moving the second compartment into the placement position advances the carrier tape the remaining number of the sprocket holes to totally advance the carrier tape the predetermined number of the sprocket holes.

22. The method of claim 21, further comprising counting the number of sprocket holes advanced in positioning and substantially stopping the second compartment, and counting the number of sprocket holes advanced in moving the second compartment into the placement position.

* * * * *